United States Patent
Freytag et al.

(10) Patent No.: US 10,649,047 B2
(45) Date of Patent: May 12, 2020

(54) MAS NMR PROBE HEAD ARRANGEMENT WITH REPLACEABLE STATOR

(71) Applicant: Bruker BioSpin AG, Faellanden (CH)

(72) Inventors: Nicolas Freytag, Binz (CH); Fabian Kuehler, Schwerzenbach (CH); David Osen, Ettlingen (DE)

(73) Assignee: BRUKER SWITZERLAND AG, Faellanden (CH)

( * ) Notice: Subject to any disclaimer, the term of this patent is extended or adjusted under 35 U.S.C. 154(b) by 0 days.

(21) Appl. No.: 16/194,900

(22) Filed: Nov. 19, 2018

(65) Prior Publication Data
US 2019/0154770 A1    May 23, 2019

(30) Foreign Application Priority Data
Nov. 20, 2017    (DE) .................... 10 2017 220 707

(51) Int. Cl.
*G01R 33/30*    (2006.01)
*G01R 33/34*    (2006.01)

(52) U.S. Cl.
CPC ....... *G01R 33/307* (2013.01); *G01R 33/3403* (2013.01); *G01R 33/34092* (2013.01)

(58) Field of Classification Search
CPC .............. G01R 33/307; G01R 33/3403; G01R 33/34092
See application file for complete search history.

(56) References Cited

U.S. PATENT DOCUMENTS

| 4,511,841 | A |   | 4/1985  | Bartuska et al. |
|-----------|---|---|---------|-----------------|
| 4,739,270 | A | * | 4/1988  | Daugaard ............ G01R 33/307 324/321 |
| 4,940,942 | A |   | 7/1990  | Bartuska et al. |
| 5,508,615 | A | * | 4/1996  | Doty .................... G01R 33/307 324/318 |
| 6,320,384 | B1 |  | 11/2001 | Doty et al. |

(Continued)

FOREIGN PATENT DOCUMENTS

| CN | 102104309 A | 6/2011 |
| CN | 106918792 A | 7/2017 |

(Continued)

OTHER PUBLICATIONS

"James N. Lee et al., Cylindrical spinner and speed controller for magic angle spinning nuclear magnetic resonance", Review of Scientific Instruments, Bd. 5., Nr. 4, Apr. 1984, 6 pages.

(Continued)

*Primary Examiner* — Rishi R Patel
(74) *Attorney, Agent, or Firm* — Edell, Shapiro & Finnan, LLC

(57) ABSTRACT

An MAS NMR probe head arrangement has a stator (2) aligned along an axis of rotation (RA) to support a rotor (1), a stator mount (32), and a RF coil arrangement (21) to emit/receive RF pulses into/from the measurement substance (40) in the rotor. The stator mount has a stator bearing (41) into which the stator can be axially inserted and extracted. The stator, when inserted, passes through the RF coil arrangement (21), and can be fed through the RF coil arrangement (21). A mechanism fixes the stator axially in the stator bearing (41) when inserted. This arrangement enhances both ease of assembly and maintenance of the arrangement.

22 Claims, 5 Drawing Sheets

(56) References Cited

U.S. PATENT DOCUMENTS

| | | |
|---|---|---|
| 6,803,764 B2 | 10/2004 | Hioka |
| 7,196,521 B2 | 3/2007 | Doty |
| 7,282,919 B2 | 10/2007 | Doty et al. |
| 7,541,807 B2 | 6/2009 | Stringer |
| 7,915,893 B2 | 3/2011 | Shevgoor et al. |
| 8,212,565 B2 | 7/2012 | Bez |
| 8,531,065 B2 | 9/2013 | Knorr et al. |
| 9,335,389 B2 | 5/2016 | Takegoshi et al. |
| 9,778,331 B2 | 10/2017 | Hunkeler et al. |
| 9,945,654 B2 | 4/2018 | Freytag |
| 10,261,143 B2 | 4/2019 | Freytag et al. |
| 2006/0082371 A1* | 4/2006 | Doty .............. G01R 33/307 324/321 |
| 2010/0321018 A1 | 12/2010 | Takegoshi et al. |
| 2013/0257432 A1 | 10/2013 | Hu et al. |
| 2016/0334478 A1 | 11/2016 | Osen et al. |

FOREIGN PATENT DOCUMENTS

| | | |
|---|---|---|
| CN | 107121651 A | 9/2017 |
| DE | 102013201110 B3 | 4/2014 |
| JP | H08007168 B2 | 1/1996 |
| JP | 2011529562 A | 12/2011 |

OTHER PUBLICATIONS

Mueller K T et al., "Dynamic-angle spinning of quadrupolar nuclei", Journal of Magnetic Resonance, Academic Press, London, GB, Bd. 86, Nr. 3, Feb. 15, 1990, p. 470-486.

* cited by examiner

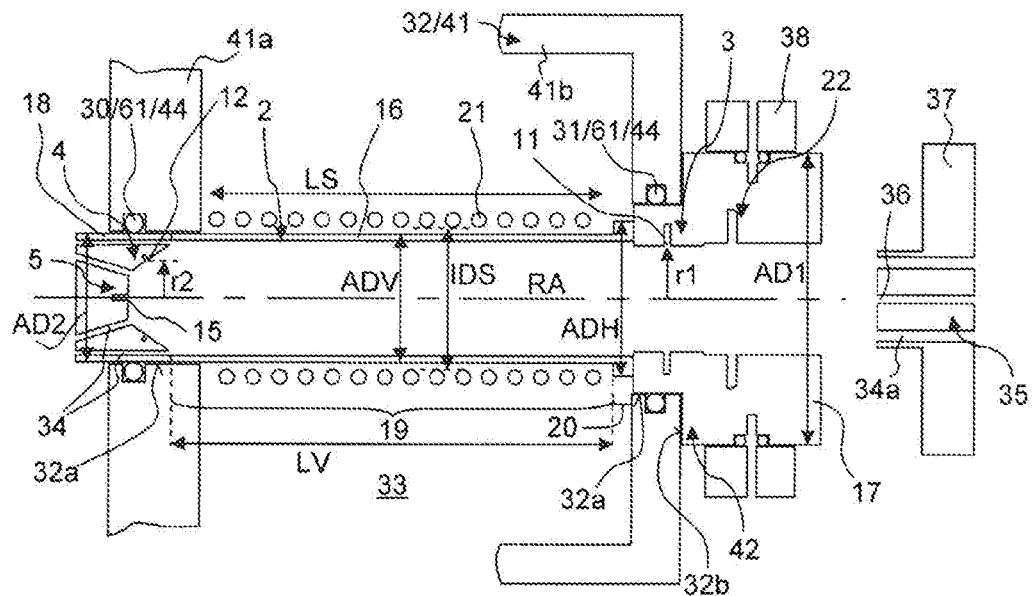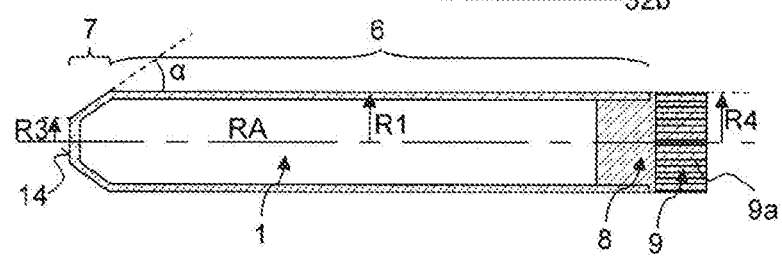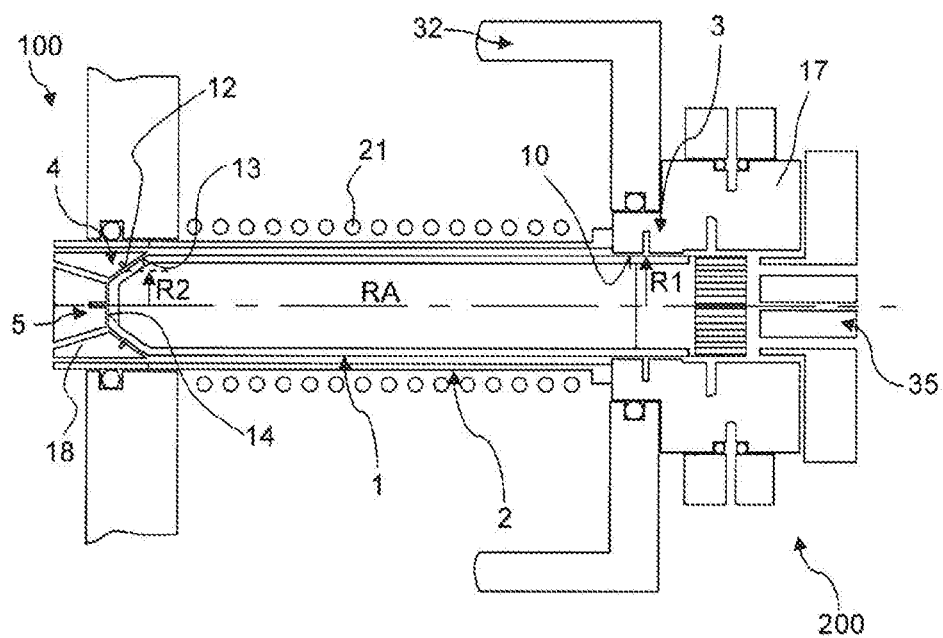
Fig. 1

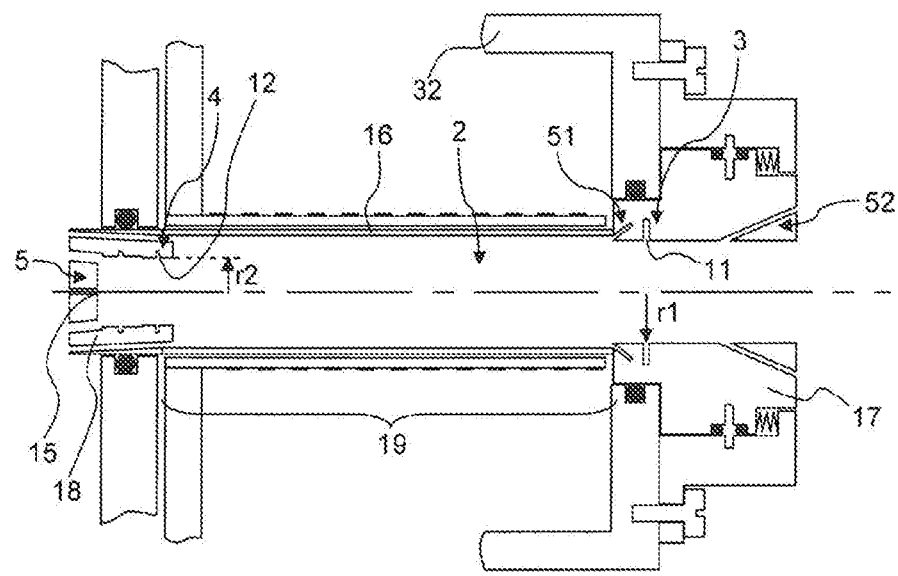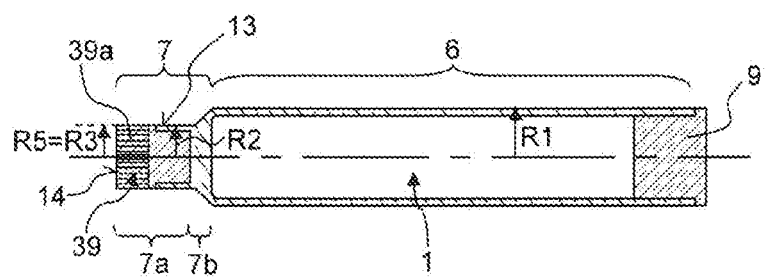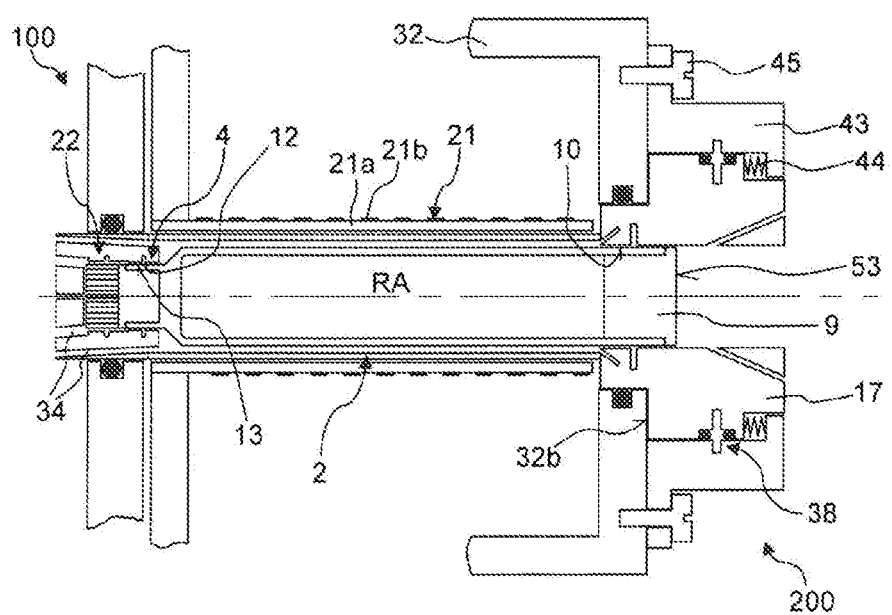
Fig. 2

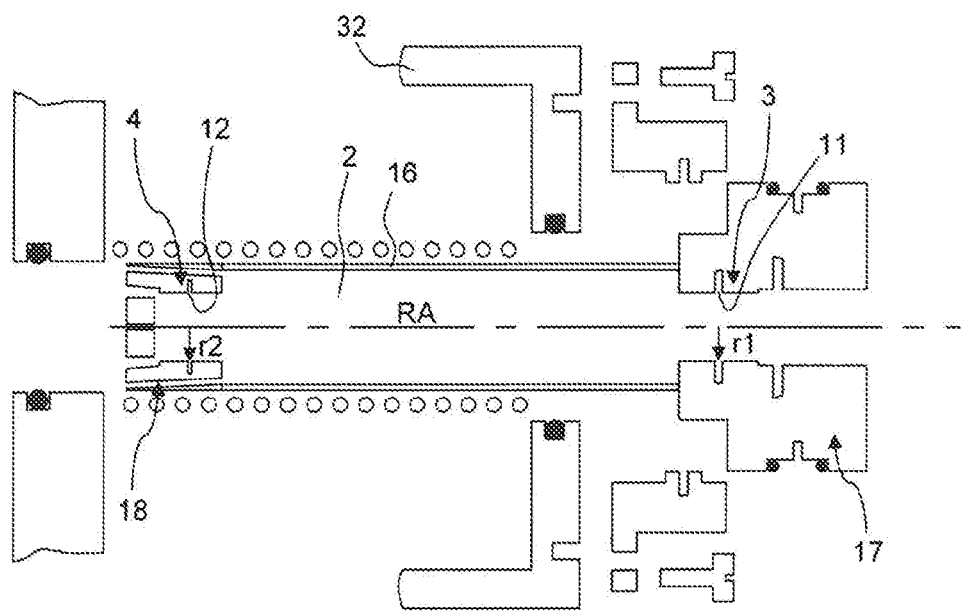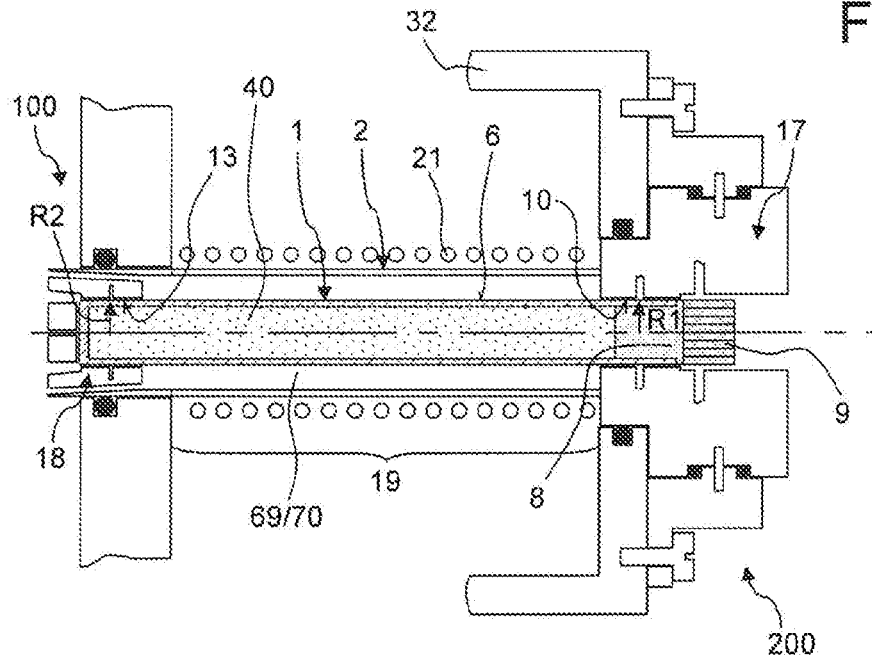
Fig. 5

MAS NMR PROBE HEAD ARRANGEMENT WITH REPLACEABLE STATOR

CROSS REFERENCE TO RELATED APPLICATIONS

This application claims foreign priority under 35 U.S.C. § 119(a)-(d) to German Application No. DE 10 2017 220 707.8 filed on Nov. 20, 2017, the entire contents of which are hereby incorporated into the present application by reference.

FIELD OF THE INVENTION

The invention relates to an MAS NMR probe head arrangement, comprising a stator aligned along an axis of rotation to support a rotor having a measurement substance, a stator mount, and an RF coil arrangement to emit RF pulses into the measurement substance in the rotor and/or to receive RF signals from the measurement substance in the rotor.

BACKGROUND

Such an MAS NMR probe head arrangement is known from U.S. Pat. No. 7,915,893 B2.

Nuclear magnetic resonance (NMR) spectroscopy is a powerful analysis method, with which the chemical composition of measurement substances (samples) can be investigated. The measurement substance is exposed to a strong, static magnetic field, which leads to the alignment of nuclear spins in the measurement substance. After exposure to radio frequency (RF) pulses, RF signals emitted by the measurement substance are detected and evaluated to determine the chemical composition of the measurement substance.

NMR spectroscopy of solid samples shows significant line broadening in measured NMR spectra due to anisotropic interactions between nuclei in the sample. For solid-state samples, the known practice is to rotate the measurement substance during the NMR measurement at the so-called "magic angle" of about 54.7° with respect to the direction of the static magnetic field (MAS: "magic angle spinning"). This makes it possible to reduce a line broadening due to dipole interactions, quadrupole interactions, and the anisotropic portion of the chemical shift—and/or to extinguish them given sufficiently high rotational frequencies.

For this purpose, the measurement substance is typically filled into an essentially cylindrical sample tube, called a rotor, and placed in a stator. The rotor is rotated relative to the stator, with the rotor floating in the stator; suitable gas flows are used for this purpose. There is an RF coil arrangement which surrounds the stator to emit RF pulses into the measurement substance and/or to receive RF signals from the measurement substance.

A stator which is constructed with a housing tube and an inner sleeve is known from U.S. Pat. No. 7,915,893 B2. A rotor is arranged in the inner sleeve. Nozzle outlet openings which point toward the rotor, for two bearings, are constructed in the inner sleeve at the same radii. One of the bearings cooperates with a cylindrical section of the rotor, and the other bearing cooperates with a conical end portion of the rotor. The stator is surrounded by a solenoid coil and a ceramic coil body, wherein the stator extends through the ceramic coil body. The stator is glued or soldered at both ends with distributor rings which have the same diameter as the ceramic coil body. Due to the fixed connection of the stator to the distributor rings, the stator is permanently arranged in the ceramic coil body. Therefore, in the event of a defect in the stator, it can only be replaced together with the ceramic coil body and the solenoid coil. This is a time-consuming and expensive process. A further design with a permanently installed stator is known from U.S. Pat. No. 7,282,919 B2.

US 2016/0334478 A1 discloses an MAS NMR probe head with a rotor and stator, having two pneumatic radial bearings and a bottom bearing. An RF coil arrangement can be arranged between the parts of the radial bearings used for the stator. The rotor is cylindrical, with equal radii on both radial bearings. Likewise, the nozzle outlet openings in the stator have the same radius on both radial bearings. In this design, the probe head can be partially disassembled in case of a defect in the stator, and a stator part can be removed radially. However, this is very complicated. If the RF coil arrangement is arranged between the parts of the radial bearing used for the stator, it is not possible to insert or extract the stator in the axial direction. Similar arrangements are known from DE 10 2013 201 110 B3 and U.S. Pat. No. 7,196,521 B2.

From U.S. Pat. No. 8,212,565 B2 and U.S. Pat. No. 4,511,841 it has become known to insert an RF coil in the radial direction in an opening in the stator. In U.S. Pat. No. 6,320,384 B1 and U.S. Pat. No. 6,803,764 B2, the RF coil is inserted into a stator structure and surrounded by it. Two-part stators, which are assembled from both sides, are known from U.S. Pat. No. 9,335,389 and US 2010/0 321 018 A1.

SUMMARY

It is an object of the invention to provide an MAS NMR probe arrangement which enables improved ease of assembly and maintenance.

This object is achieved, according to one formulation and in a surprisingly simple and effective manner, by an MAS NMR probe head arrangement of the type named above, which is characterized in that:
the stator mount is formed with a stator bearing into which the stator can be axially inserted and extracted,
wherein the stator, when inserted, passes through the RF coil arrangement, and can be fed through the RF coil arrangement for its insertion and extraction,
and wherein the probe head arrangement comprises a mechanism with which the stator can be fixed axially in the stator bearing when inserted.

In the context of the invention, the stator and the stator mount and/or the MAS NMR probe head arrangement are designed in such a manner that the stator can be inserted into or pulled out of the stator bearing in the axial direction (along the axis of rotation of the rotor, in the normal operation scenario). This allows the stator to be easily assembled and disassembled—for example, for maintenance purposes. The installation and removal in the axial direction is a much easier option than the same in the radial direction—particularly without the time-consuming dismantling of the MAS NMR probe head arrangement. In addition, a replacement of the stator, if needed, can be limited to the stator itself; further components of the MAS NMR probe head (in particular, an RF coil arrangement) generally do not need to be replaced. However, it may be necessary to detach and re-attach gas lines (for drive and/or air bearing and/or temperature control), but this requires only a small effort.

The stator is axially movably mounted in the stator mount and/or in the stator bearing and can be axially fixed when inserted in a mechanically reversible and/or temporary manner, typically by a clamping or a bracing. The stator can particularly be fixed axially by a positive engagement (using a retaining part which engages axially rearward) and/or a friction fit (using a retaining part which presses radially). It is sufficient if the axial fixation can effectively withstand the forces typically occurring in normal operation (measuring operation), but can be overcome by a greater force. A simple axial fixation of the stator can be achieved, for example, via elastic elements, in particular sealing rings, which press radially on the stator and particularly surround the stator.

The stator bearing positions the stator radially when inserted, and preferably also positions it with respect to a rotational position about the axis of rotation. The stator is arranged, in the normal state, in the inserted state—that is, in the stator bearing. In this state, rotors can be inserted into (and extracted from) the stator for the measurement of each measurement substance.

When the RF coil arrangement is installed, the stator can be inserted into and extracted from the probe head arrangement as a whole, for installation or for maintenance purposes, and can particularly be removed from the probe head arrangement. Then, for example, it is easier to perform cleaning work on the stator (for example, if the measurement substance has been released due to broken rotors), and damaged stators can be replaced more easily—in particular, without removal of the RF coil arrangement.

EXEMPLARY EMBODIMENTS OF THE INVENTION

In a preferred embodiment of the probe head arrangement of the invention,
the stator comprises a first bearing base, a sleeve element, and a second bearing base, wherein
the sleeve element connects the first bearing base and the second bearing base axially, and
wherein the first bearing base is designed as a first pneumatic bearing and the second bearing base is designed as a second pneumatic bearing,
the second bearing base has a greatest outer diameter AD2, the sleeve element has a frontal section which adjoins the second bearing base axially and has a greatest external diameter ADV,
the RF coil arrangement has a least inner diameter IDS, and AD2<IDS and ADV<IDS.

This design ensures in a simple manner that a frontal section of the stator fits into and through the RF coil arrangement. When inserted, the front section of the sleeve element and the second bearing base of the stator pass through the RF coil arrangement. This design has proven particularly useful in practice. Due to the smaller external diameter of the second support base and front section of the sleeve element (that is, of the whole frontal portion of the stator) in relation to the internal diameter of the RF coil arrangement, it is possible to easily pass the stator through the RF coil arrangement. The frontal section typically has a length LV, where LV≥0.5×LS, or LV≥1.0×LS, where LS: length of the RF coil arrangement (in the case of several nested sub-coils, with respect to an innermost sub-coil). Typically, the stator projects into the RF coil arrangement until just before the first pneumatic bearing. On the one hand, gas flow pathways between the rotor and the stator, and on the other hand, spaces within and/or outside of the stator and/or sleeve element, can be configured using the sleeve element to achieve particularly optimized conditions customized for an MAS NMR measurement under special conditions—for example, at special temperatures or pressure conditions. In addition, a stator component can be configured using the connecting sleeve element to be manageable as a whole.

In a preferred development of this embodiment, the first bearing base and/or the sleeve element has a greatest external diameter AD1 in the region of the first bearing base, and AD1>IDS. The first bearing base in this embodiment can utilize a greater radial space than is possible inside or beyond the RF coil arrangement (for the second bearing base). A particularly robust and rigid first pneumatic bearing can be achieved in this way.

Also advantageous is a development in which the stator mount has a first seal with which the first bearing base and/or the sleeve element is sealed in a gas-tight manner against the stator mount in the region of the first bearing base. Also advantageous is a development in which the stator mount has a second seal with which the second bearing base and/or the sleeve element is sealed in a gas-tight manner against the stator mount in the region of the second bearing base. In particular, the first and second seals can also be used together. The seals can establish and guide gas flows—for example, for drive, air bearing, or temperature control—and create gas spaces which are separated from each other, for example to achieve a temperature control of one or more regions of the probe head arrangement. The seals are typically made of an elastomer, such as rubber. In addition, the seals can serve or contribute to the axial fixation of the stator.

Particularly preferred is a development in which the sleeve element is gas-tight. In this way, the sleeve element can contribute particularly well to directing gas flows in the rotor and/or stator and to establishing gas spaces which are separate from each other, so as to create conditions which are optimized for MAS NMR measurements. In particular, the temperature of the rotor can be controlled independently of the RF coil arrangement. For example, the rotor and/or the measurement substance can be cooled.

Preference is also given to a development in which the probe head arrangement, when the stator is inserted, forms a gas-tight space which is bounded by the sleeve element, and in which the RF coil arrangement is arranged. The sleeve element then serves not only as a structural component which connects the bearing bases to each other in order to make the stator manageable as a whole, but also serves (when inserted) as a partition wall for the gas-tight space of the RF coil arrangement. This achieves a particularly compact construction in the radial direction. In addition, it is possible to specifically subject the RF coil arrangement to specific conditions—particularly conditions other than the conditions in the rotor or in the vicinity of the probe head (i.e., the probe head arrangement)—so as to optimize the MAS NMR measurement.

It is particularly preferred if the gas-tight space is evacuated. As a result, the RF coil arrangement can have very good thermal insulation.

It is also advantageous if the RF coil arrangement is cooled in the gas-tight space to a cryogenic temperature T, particularly T≤100 K, particularly preferably where T≤40 K or T≤20 K. Due to a cryogenic temperature of the RF coil arrangement, the signal-to-noise ratio of an MAS NMR measurement can be improved. Note that the space around the rotor (in particular inside the stator) is typically at room temperature (alternatively, the rotor and/or the measurement substance can also be temperature-controlled through gas flows).

It is also preferred that a space surrounding the rotor, and in particular inside the stator, is cooled to a temperature $T_R$, preferably where $T_R$≤300 K, particularly preferably where $T_R \leq 100$ K or $T_R \leq 20$ K. The cooling makes it possible to influence processes in the measurement sample, such as spin relaxations—particularly to slow them down—so as to establish desired conditions for the MAS NMR measurement. The cooling is typically accomplished by the drive gas and/or the bearing gas. By contrast, the gas-tight space in which the RF coil arrangement is arranged is typically at room temperature (alternatively, another specific temperature can also be set in the gas-tight space or in the RF coil arrangement).

Preferably, a control device is included, with which a space surrounding the rotor, in particular within the stator, can be adjusted relative to the temperature $T_R$ to a temperature range—preferably where $0°$ C.$\leq T_R \leq 80°$ C., and more preferably $-40°$ C.$\leq T_R \leq 150°$ C. This temperature range is particularly relevant for biological samples; in particular, a denaturing of proteins can be prevented if the rotor temperature can be kept below the denaturing temperature during operation.

Also preferred is an embodiment in which the mechanism with which the stator is axially fixed in the stator bearing when inserted comprise a movable or detachable retaining part which engages axially behind the stator in a retaining position—in particular, wherein the movable or detachable retaining part engages with the stator in the region of the first bearing base. An axial engagement from behind enables a particularly reliable axial fixation. Typically, the stator is elastically braced by the retaining part (when in the retaining position) in the axial direction against the (rest of the) stator mount, in order to prevent axial play. The retaining part is usually bolted (when in the retaining position) to the (rest of the) stator mount. In a non-retaining position (such as a retracted, folded-away or lifted position), the axial travel path for the stator is free—for instance, for a removal of the stator. An elastic element which presses axially on the stator can be arranged on the retaining part which engages axially from behind. Alternatively, a movable retaining part can press radially against the stator when in a retaining position, for example via an elastic element (having an elastomeric body or a spring, by way of example) to fix it by a friction fit. The movable retaining part may, for example, be designed as a threaded bolt with the elastic element arranged on its front end.

In an advantageous embodiment, the mechanism by which the stator can be axially fixed in the stator bearing when inserted includes at least one stationary retaining part, wherein the stationary retaining part is designed with an elastic element which, when the stator is inserted, presses against the stator in the radial direction—in particular, wherein two stationary retaining parts which are designed as sealing rings are included. A stationary (with respect to the stator mount) retaining part is particularly easy to configure. The at least one stationary retaining part secures the stator, when inserted, by a friction fit. The holding force is sufficient to keep the stator axially fixed during normal operation (measuring operation). For installation or maintenance, however, the stator can be inserted into and extracted from the stator bearing in the axial direction, opposing the holding force. The elastic element is typically made of elastomeric material—particularly fluoroelastomers for use at temperatures above $150°$ C. and silicone rubber or fluorosilicone rubber for use below $-40°$ C. Alternatively, the elastic element can also be realized from a less-elastic material such as PTFE, or a combination of a less-elastic material and pretensioning elements, for example in the form of springs.

Additionally to axial retention, gaskets can provide a gas seal—for instance, to establish an evacuated space for the RF coil arrangement.

Also preferred is an embodiment in which the stator mount forms an axial stop which defines a maximum axial insertion position of the stator in the stator mount, particularly wherein the axial stop co-operates with a shoulder of the stator, said shoulder formed by the first bearing base or the sleeve element in a region surrounding the first bearing base. The stop enables defining, in a simple manner, the axial position of the stator, and thus also of a rotor arranged in it. Typically, the stator is pressed against the stop using the axial fixation. Due to the shoulder formed on the first bearing base or on the sleeve element in a region which surrounds the first bearing base, the sample of a volume which can be inserted into the RF coil arrangement is not negatively affected. As a result, particularly large sample volumes can be utilized.

Also preferred is an embodiment in which:
the first pneumatic bearing and the second pneumatic bearing are designed to radially support a rotor in the stator,
and a rotor is inserted into the stator which forms a first bearing surface at a radius R1 in the region of the first pneumatic bearing on a circular cylindrical section of the rotor, and which forms a second bearing surface at a radius R2 in the region of the second pneumatic bearing. The two pneumatic bearings hold the stator in position radially ("radial bearings"). It should be noted that the second bearing surface may be on a circular-cylindrical surface (particularly on an end section) and/or on a conical surface (particularly on an end section) of the rotor. The radius Ri of the bearing surfaces refers to the position centered with respect to the associated nozzle outlet openings in the stator; in the case of a plurality of nozzle outlet openings at different axial positions, the radius of the bearing surfaces refers to a central axial position of the nozzle outlet openings. The same applies for the radii ri of nozzle outlet openings on the stator.

Embodiment Having a Rotor which Narrows at the Front End

An embodiment in which R2<R1, particularly wherein AD2=ADV as well, is particularly preferred. The narrower design of the front, second bearing surface with radius R2 relative to the rear, first bearing surface and/or the circular cylindrical section of the rotor with radius R1 provides a radial space for the construction of the second bearing (radial bearing) and/or the part thereof for the stator. Accordingly, the second bearing can be narrower in design on the side facing the stator than the first bearing.

Note that the second bearing is constructed in such a case on an end section of the rotor which has a radius which is smaller with respect to the circular-cylindrical section, or which narrows distally from the circular-cylindrical section.

An MAS NMR rotor system corresponding to this development, comprising a rotor and stator, can then be radially narrower on one end (the front, near the second pneumatic bearing) than on the other end (the rear, near the first pneumatic bearing). This enables the front end (comprising the end section and at least a portion of the circular-cylindrical section) of the rotor system to be easily inserted into a radially confined space into which the rearward end (with the first pneumatic bearing) would not fit.

Due to the geometry according to the invention, an RF coil arrangement (an RF coil system), into which the stator and the rotor are introduced in the axial direction, can approach very close to the rotor and/or the measurement substance. The usable volume for the measurement substance in the interior of the RF coil arrangement is not determined by the radial width of the first pneumatic bearing acting on the circular-cylindrical section, but rather only by the radial width of the second pneumatic bearing arranged on the radially smaller end section (or by the circular-cylindrical section itself, if it has a greater radial width). Overall, a very compact construction of the rotor system is possible.

If the rotor system is inserted axially into an RF coil arrangement, it is generally possible to very easily replace the rotor system in this RF coil arrangement. In particular, the stator can be manipulated (i.e., inserted or extracted) without having to remove the RF coil arrangement from its probe head arrangement. An insulation, such as a vacuum insulation, for the RF coil arrangement is very easy to configure, especially with an inner wall extending essentially in the axial direction with a constant inner radius. Such an insulation can particularly be used with the rotor system according to the invention. In particular, a part of the stator (such as the sleeve element) can be used as the radially inner part or inner wall of an insulation of an RF coil arrangement (see above).

A narrowing in the radius R2 in the end section with respect to the radius R1 in the circular-cylindrical section along the axial direction can be continuous, continuous in sections, or with one or more steps. In addition, the circular-cylindrical section can transition to the end section continuously or else with one step. Note that the second bearing surface can run parallel to the axis of rotation, or with a cone angle to the axis of rotation; the second bearing (and also the first bearing) holds the rotor in position in the radial direction.

It is most commonly possible to achieve optimal space utilization for a maximum sample volume in the interior of the RF coil arrangement when ADV=AD2.

Embodiment Having a Rotor with the Same Radial Bearing Diameters

In an alternative embodiment, R2=R1, and the second bearing surface is formed on the circular-cylindrical section of the rotor. Such a rotor/stator system is particularly easy to manufacture, but does not allow such small distances between the RF coil arrangement and the measurement substance in the rotor.

Further Embodiments

Also preferred is an embodiment in which a third pneumatic bearing is also constructed in one of the bearing bases, in particular in the second bearing base, by which a rotor arranged in the stator can be held axially—in particular, wherein the rotor has a third bearing surface oriented perpendicular to the axis of rotation. With the third pneumatic bearing, an axial holding force can be exerted on the rotor in order to prevent contact of the rotor in the stator.

In this case, a counter bearing can also be constructed in the other bearing base—in particular, in the first bearing base—with which the rotor arranged in the stator can additionally be held axially. The third pneumatic bearing can be supported by the counter bearing, for example by the exertion of pressure on the counter bearing. The counter bearing can particularly be designed as:

a pneumatic axial bearing, particularly having at least one nozzle outlet opening in the stator and having a fourth bearing surface on an axial end of the rotor which is orthogonal to the axis of rotation,
a pneumatic conical bearing,
a bearing based on a passive counter-pressure build-up, in particular with a stopper or an aperture,
a bearing based on an active counter-pressure build-up, in particular with a movable stopper, variable aperture, or with air blowing, without a bearing surface.

Use According to the Invention

The scope of the present invention also includes a use of a probe arrangement according to the invention described above, for the purpose of measuring a measurement substance loaded in a rotor, in an MAS NMR experiment, wherein the rotor is arranged in the stator, the stator is inserted into the stator bearing and fixed, and the rotor rotates about the axis of rotation, preferably with a frequency of at least 1 kHz and more preferably with a frequency of at least 10 kHz. In particular, between MAS NMR experiments, as needed (for instance, for maintenance or replacement in the event of damage), a stator may be axially extracted from the stator bearing, and a stator may be reinserted into the stator bearing, without dismantling the RF coil arrangement.

Further advantages of the invention will become apparent from the description and the drawings. Likewise, the features mentioned above and explained further below can each be realized according to the invention individually or in a variety of free combinations. The embodiments shown and described here are not to be understood as an exhaustive enumeration; rather, they serve as exemplary explanations of the invention.

BRIEF DESCRIPTION OF THE DRAWINGS

Embodiments of the invention are illustrated in the drawings and are explained in more detail below. In the drawings, FIG. 1 shows a schematic cross-section of a first design type of an MAS NMR rotor system for the invention, having a frusto-conical front end section. The stator comprises a sleeve element, an axial bearing, two radial bearings, and a counter bearing. The drive is formed on the side opposite the axial bearing. The design shown here includes a fixation of the stator in the stator mount via O-rings; it is not secured axially in any other way. In addition, an RF coil arrangement consisting of a wire coil is illustrated;

FIG. 2 shows a schematic cross-section of a second design of an MAS NMR rotor system for the invention, having a largely circular-cylindrical front end section. The stator comprises a sleeve element, an axial bearing, two radial bearings, and a drive, which is formed in the region of the front end section. The design shown here includes an axial securing of the stator in the stator mount utilizing spring force. In addition, an RF coil arrangement comprising a coil carrier with attached RF coil is illustrated;

FIG. 5 shows a schematic cross-section of a fourth design of an MAS NMR rotor system for the invention, similar to that shown in FIG. 3 but with a fully circular-cylindrical rotor.

DETAILED DESCRIPTION

Figure 3:
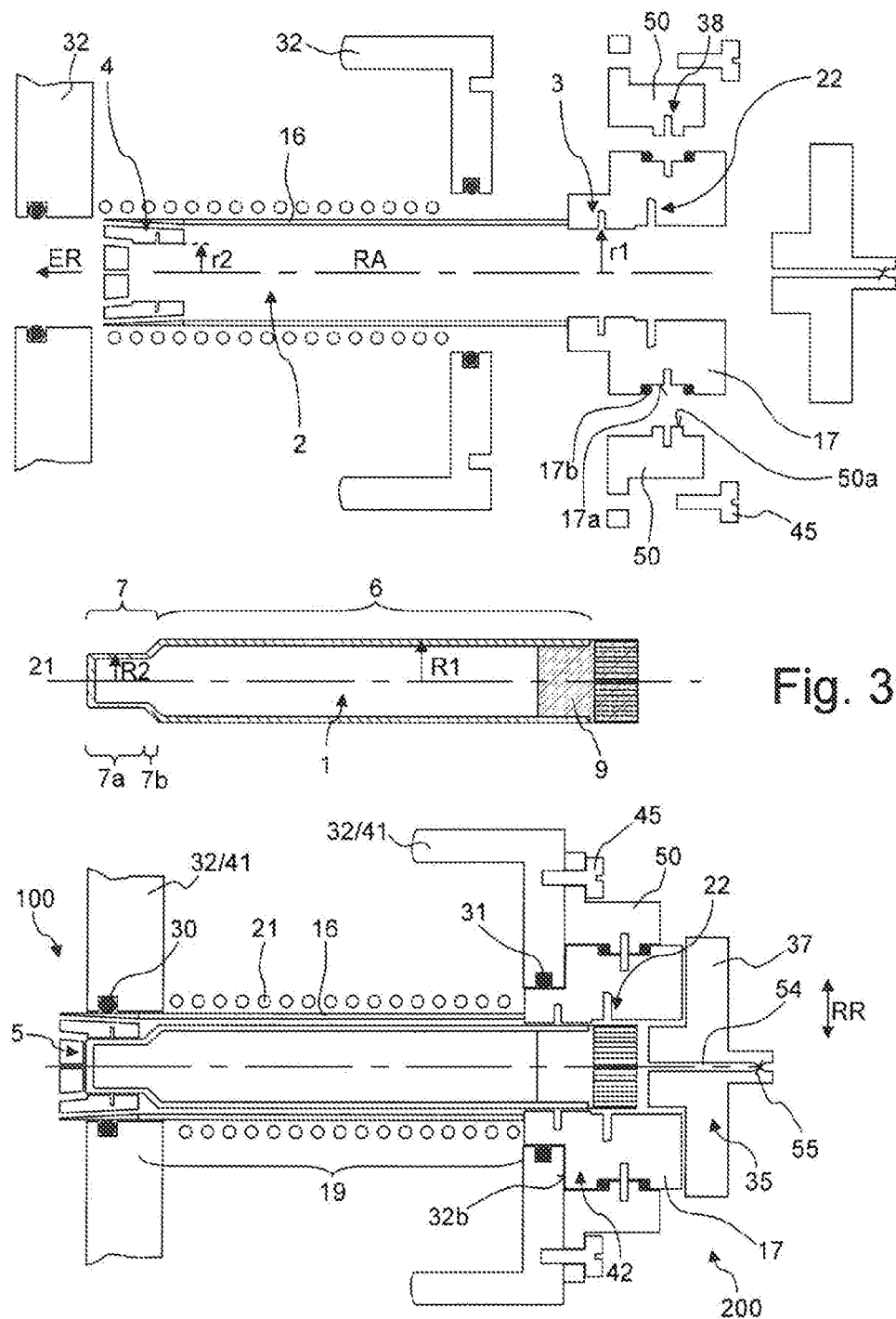
FIG. 3 shows a schematic cross-section of a third embodiment of an MAS NMR rotor system for the invention, with a largely circular-cylindrical front end section. The stator comprises a sleeve element, an axial bearing, two radial bearings, and a drive, which is formed in the rearward region of the rotor relative to the axial bearing, and has a flow restriction for the turbine exhaust air to increase the holding force of the rotor in the stator. The design shown here includes an axial securing of the stator in the stator mount utilizing the gas connections for bearing and drive.

FIG. 1 shows a first design of an MAS NMR rotor system 100 for the invention, comprising a rotor 1, in which a measurement substance in solid or semisolid form (for example a powder or gel) is arranged, and a stator 2. FIG. 1 shows the stator 2 (together with parts of a stator mount 32) at top; FIG. 1 center shows the rotor 1, and FIG. 1 at bottom shows the entire MAS NMR rotor system 100 with the rotor 1 and stator 2 (together with parts of the stator mount 32). The MAS NMR rotor system 100 and the stator mount 32 are part of a probe head arrangement 200 according to the invention.

The stator 2 comprises a first pneumatic bearing (in this case, a radial bearing) 3, a second pneumatic bearing (in this case, a radial bearing) 4, and a third pneumatic bearing (in this case, an axial bearing) 5. The rotor 1 is mounted inside the stator 2 in a manner allowing rotation about an axis of rotation RA.

The rotor 1 comprises a circular-cylindrical section 6 and an end section 7 which forms the left-most (front), closed end of the rotor 1 in FIG. 1. The end section 7 in this case forms a frusto-conical shape and tapers towards the left end. A cone angle α of the end section 7 relative to the axis of rotation RA is about 30° in this case; preference is generally given to the range 10° to 45°. An opening 8 is formed at the right-most (rear) end of the rotor 1, and is closed with a cap 9, such that a measurement substance loaded in the rotor 1 is not lost during an NMR experiment. Counterstructures 9a, such as baffles (only schematically indicated) are constructed on the cap 9. These enable the rotation of the rotor 1 about the axis of rotation RA using a suitable gas flow of a pneumatic drive 22. The outer radius R4 of the cap 9 corresponds approximately to the radius R1 of the rotor 1 in the circular-cylindrical section 6.

The circular-cylindrical section 6 has the (outer) radius R1 and forms a first bearing surface 10 for the first pneumatic bearing (radial bearing) 3. Nozzle outlet openings 11 (at the inner end of the nozzle outlet bore) of the first pneumatic bearing (radial bearing) 3 facing the stator are arranged on a radius r1 with respect to the axis of rotation RA.

The second pneumatic bearing (radial bearing) 4 has nozzle outlet openings 12 at a radius r2. The radius r2 is significantly smaller than r1—in this case, r2 is approx. 0.65×r1. The radius R2 on the end section 7 opposite the nozzle outlet openings 12, where a second bearing surface 13 is formed, is significantly less than R1; in this case, R2 is approx. 0.65×R1. The second pneumatic bearing (radial bearing) 4 not only provides the radial support of the rotor 1 in the region of the front end, but can also contribute to the axial retention of the rotor 1 if the flow conditions are designed accordingly.

On the left (front) axial end of the rotor 1, the rotor 1 forms a third bearing surface 14 which, together with a nozzle outlet opening 15, forms the third pneumatic bearing (axial bearing) 5. The third bearing surface 14 is perpendicular to the axis of rotation RA and has an outer radius R3, which in turn is significantly smaller than R1—in this case, R3 is approx. 0.5×R1.

The stator-facing parts of the second pneumatic bearing (radial bearing) 4 and the third pneumatic bearing (axial bearing) 5 surround the third bearing surface 14 like a cup—as well as the remaining end section 7. In addition to the nozzle outlet openings 12, 15, there are exhaust air outlet openings 34 in the stator 2 to direct the exhaust air from the axial bearing 5, the second radial bearing 4, and also—depending on the design, but at least in part—from the first pneumatic bearing (radial bearing) 3 to the outside, along with any air which may be present for temperature control. This serves the purpose of preventing or minimizing a back pressure that would compromise the holding force of the axial bearing 5. The end section 7 extends in this case over about 6.5% of the entire length of the rotor 1 (including the cap 9); general preference is given to the range 5% to 25%.

In the embodiment shown in FIG. 1, the parts of the second pneumatic bearing (radial bearing) 4 and the third pneumatic bearing (axial bearing) 5 which face the stator are arranged such that they extend radially approximately as far as the radius R1 of the circular-cylindrical section 6. In this case, r2<R1. On the other hand, the parts of the first pneumatic bearing (radial bearing) 3 which face the stator encompass a space beyond R1.

The stator 2 forms a unitary component, as shown in FIG. 1. For this purpose, the stator 2 has a sleeve element 16, which mechanically connects a first bearing base 17, which accommodates the part of the first pneumatic bearing and/or radial bearing 3 which faces the stator, to a second bearing base 18 which accommodates the part of the second pneumatic bearing and/or radial bearing 4 which faces the stator (and also the part of the third pneumatic bearing and/or axial bearing 5 which faces the stator). The sleeve element 16 has a frontal section 19 which adjoins the second bearing base 18 and has a (greatest) external diameter ADV, and also has a rear section 20 in this case with a (greatest) external diameter ADH, which adjoins the first bearing element 17. The (greatest) external diameter of the first bearing base 17 is AD1, and the (greatest) external diameter of the second bearing base 18 is AD2.

The stator 2 of the MAS NMR rotor system 100, and specifically the second bearing base 18 and the frontal section 19 of the sleeve element 16, pass through an RF coil arrangement 21 which has a least internal diameter IDS. The frontal section 19 has an axial length LV which is slightly greater in this case than the axial length LS of the RF coil arrangement 21. The RF coil arrangement is designed here as a self-supporting wire coil (with no coil carrier).

The MAS NMR rotor system 100 has been pushed axially into the RF coil arrangement 21 until reaching the rear section 20 (here, from the right side). For this configuration, AD2<IDS and ADV<IDS, and ADV=AD2 in this case. The rotor 1 and/or the measured substance contained therein can approach radially very close to the RF coil arrangement 21. However, AD1>IDS, such that the first pneumatic bearing (radial bearing) 3 can be designed with a large radius r1 at the nozzle outlet openings 11, wherein AD1>IDS is possible so as to improve the (rear) radial bearing of the rotor 1. For maintenance purposes, it is readily possible to axially pull the stator 2 out of the RF coil arrangement 21 (to the right, in this case) and to push it back into the RF coil arrangement 21 (here, to the left) after a repair (or a replacement, if necessary), without removing the RF coil arrangement 21 from the MAS NMR probe arrangement 200.

If the third pneumatic bearing (axial bearing) 5—optionally together with the contribution which the second pneumatic bearing (radial bearing) 4 makes for providing retention—is not sufficient to keep the rotor 1 in position in the axial direction during rotary operation, a counter bearing 35 (as shown in FIG. 1) can be provided which, in this case, uses a gas flow flowing through a nozzle outlet opening 36 on the end with the cap, by way of example, to push the rotor 1 toward the axial bearing 5. The counter bearing 35 can be formed in a hinged or sliding stator part which can be opened or slid back for a change of the stator, or can be installed with each rotor change—for example, by screwing on the same (not shown in detail). In the embodiment shown, the counter bearing 35 is integrated into a closure cap 37 with which the stator 2 is closed when the rotor 1 is inserted; the closure cap 37 in this case also has air outlet openings 34a.

The stator 2 is mounted in a stator mount 32 which forms a stator bearing 41 for the stator 2, into which the stator 2 can be inserted and removed axially (parallel to the axis of rotation RA); the inserted state is shown in FIG. 1 above and below. The stator bearing 41 in this case comprises a front part 41a which in the illustrated embodiment surrounds the second bearing base 18 and forms a radial boundary 32a for a potential radial movement of the stator 2. Furthermore, the stator bearing 41 in this case comprises a rear part 41b which in the embodiments shown surrounds the first bearing base 17 and also forms a radial boundary 32a. The rear part 41b also forms an axial stop 32b for the stator 2, against which a shoulder 42 of the first bearing base 17 abuts. The RF coil arrangement 21, which is fixed in the MAS NMR probe head arrangement 200 in a manner not shown—generally on the stator mount 32 (but not on the stator 2)—is arranged between the parts 41a, 41b of the stator bearing 41, directly radially adjacent to the sleeve element 16.

Grooves in which seals (sealing rings) 30, 31 are arranged—in this case, O-rings of elastic material, such as rubber—are provided in the parts 41a, 41b of the stator bearing 41. These press circumferentially on the outer sides of the second bearing base 18 and the first bearing base 17. This seals a gas-tight, evacuated space 33 which is also bounded radially inwardly by the sleeve element 16. In this evacuated space 33, the temperature of the RF coil arrangement 21 contained therein can be controlled if there is good thermal insulation—in particular, to a cryogenic temperature of, for example, 20 K.

The seals 31, 30 act in the embodiment of FIG. 1 as stationary (that is, immovable in the stator mount 32) retaining parts 61, which also have the function of elastic elements 44 which radially clamp the inserted stator 2 and thereby fix the stator 2 axially with a force fit—to the extent that this is required in normal operation with regard to the expected forces. However, with a greater force, the stator 2 can be pulled out axially (in this case, to the right)—for example, for maintenance—without any further mechanisms having to be released. It should be noted that when the stator 2 is reinserted into the stator mount 32, a certain force (mechanical resistance) at the seals 31, 30 must be overcome.

A gas power supply 38 is also connected to the stator 2—in this case, on the first bearing base 17.

FIG. 2 shows a second design of an MAS NMR rotor system 100 for the invention, which largely corresponds to the design of FIG. 1, such that only the main differences will be discussed below. The stator 2 (with parts of a stator mount 32) is shown again at top, the rotor 1 is shown in the middle, and the MAS NMR rotor system 100 with rotor 1 and stator 2 is shown below. The MAS NMR rotor system 100 and the stator mount 32 are part of a probe head arrangement 200 according to the invention.

In the embodiment shown, the rotor 1 has an end section 7 which is circular-cylindrical in a front part 7a and is conical (frusto-conical) in a rear part 7b leading to the circular-cylindrical section 6. The end section 7 forms the second bearing surface 13 of the second pneumatic bearing (in this case, the radial bearing) 4 in the region of the circular-cylindrical front part 7a opposite the nozzle outlet openings 12. The radius R2 of the second bearing surface 13 is equal to the radius R3 of the third bearing surface 14 of the third pneumatic bearing (in this case, the axial bearing) 5, opposite the nozzle outlet opening 15. Both R2 and R3 are significantly smaller than the radius R1 of the first bearing surface 10 opposite the nozzle outlet openings 11 of the first pneumatic bearing (in this case, the radial bearing) 3. A portion of the end section 7 is formed in this case by a cap attachment 39 of the rotor 1. Counter-structures 39a, such as baffles, for a drive gas flow of a drive 22 with which the rotor 1 can be set in rotation about the axis of rotation RA, are formed on the cap attachment 39.

The nozzle outlet openings 12 of the second pneumatic bearing (radial bearing) 4 are situated at a significantly smaller radius r2 than the radius r1 of the nozzle outlet openings 11 of the first pneumatic bearing (radial bearing) 3, which is also significantly smaller than the (outer) radius R1 of the cylindrical section 6, such that here too, a very compact design is achievable, enabling easy axial insertion into an RF coil arrangement 21 from the side. The RF coil arrangement 21 in this case is designed with a tubular coil support 21a on the outside of which are arranged the conductor elements 21b of the RF coil arrangement 21.

In the illustrated embodiment, the stator 2 has temperature control-gas nozzles 51, with which the temperature in the stator 2 around the rotor 1—and accordingly also in the rotor 1—can be set as desired. By way of example, a moderate cooling of the measurement substance in the rotor 1 can be carried out in order to prevent denaturing of proteins during an NMR measurement—for example to about 0° C. Furthermore, compressed gas nozzles 52 are included in this case, with which the pressure on a baffle 53 of the rotor 1, formed in this case on the cap 9, can be adjusted to secure the axial position of the rotor 1 during rotation about the axis of rotation RA.

In this embodiment, an equal or greater gas flow may be used on the second pneumatic bearing (the radial bearing) 4 compared to the first pneumatic bearing (the radial bearing) 3 to achieve approximately the same radial bearing stiffness. In particular, the second radial bearing 4 can be subjected to a higher pressure than the first radial bearing. If necessary, a counter bearing may also be provided in this embodiment (not shown, but see FIG. 1 and FIG. 3).

In the embodiment of FIG. 2, a removable retaining part 43 is included which engages with the stator 2 from behind on the first bearing base 17. The removable retaining part 43 is shown in a retaining position screwed to the stator mount 32—cf. the screws 45. The retaining element 43 pushes, with elastic elements 44—in this case, springs, or alternatively elastomeric elements—against the stator 2 from behind, thereby fixing the same against the axial stop 32b. The stator 2 is thus elastically clamped against the axial stop 32b. In order to pull the stator 2 axially out of the stator mount 32 (in this case, to the right), the screws 45 can be released and the retaining part 43 (including the springs) can be removed.

Note that the detachable retaining part 43 also includes a gas power supply 38 in this case.

The sleeve tube 16 in this case has no rear section, which would be radially wider with respect to a frontal section 19. As such, the frontal section 19 (which can be inserted into the RF coil arrangement) extends in this case over the entire length of the sleeve tube 16.

FIG. 3 shows a third design of an MAS NMR rotor system 100 for the invention, which largely corresponds to the embodiment of FIG. 1, such that only the main differences will be discussed below. The stator 2 is shown again at top, but in a state of only-partial insertion into the stator mount 32 in the insertion direction ER, with the retaining part 50 not yet installed. The rotor 1 is shown in the middle, and the MAS NMR rotor system 100 as a whole, with rotor 1 and stator 2, is shown below. The MAS NMR rotor system 100 and the stator mount 32 are part of a probe head arrangement 200 according to the invention.

In this design, the rotor 1 in turn has an end section 7 with a circular-cylindrical front part 7a and a conical rear part 7b (see FIG. 2), but without using a cap attachment on the front end. The pneumatic drive 22 engages with a cap 9 at the rear end of the rotor 1. The sleeve tube 16 in this case has no rear section, which would be radially wider with respect to a frontal section 19. As such, the frontal section 19 (which can be insertable into the RF coil arrangement 21) extends in this case over the entire length of the sleeve tube 16.

The retaining part 50 (in this case, comprising a plurality of separate components) serves the purpose of securing the stator 2 in the stator bearing 41 in an axially fully-inserted state (with respect to the insertion direction ER and/or along the axis of rotation RA) (see FIG. 3 below, with shoulder 42 and axial stop 32b mutually abutting), such that the stator 2 cannot move axially during a measurement.

The retaining part 50 has noses 50a which can be inserted into grooves 17a on the first bearing base 17. When the noses 50a are inserted, the retaining part 50 can be screwed with screws 45 against the stator mount 3—see FIG. 3 below for the screwed-in state. Via seals 17b which are pressed-in in the radial direction RR, or directly via the noses 50a and respective groove bottoms of the grooves 17a, the stator 2 is clamped in the radial direction RR. Due to a friction fit, a further securing of the stator 2 in the axial direction in the stator bearing 41 is achieved by the action of the seals and/or O-rings 30, 31. In addition, the noses 50a also engage behind the first bearing base 17 in the grooves 17a with respect to the axial direction, thereby realizing an additional retention.

The retaining part 50 in this case also includes the gas flow feed 38, wherein the seals 17b seal the supply gas feed.

A counter bearing 35 is configured in this case in the closure cap 37; in the same, the outflow of the drive air of the drive 22 is restricted such that a back pressure builds up which pushes the rotor 1 toward the third pneumatic bearing (in this case, the axial bearing) 5. An adjustable gas flow-limiting device—in this case, a variable aperture 55—is included for this purpose in a gas outlet channel 54.

Figure 4:
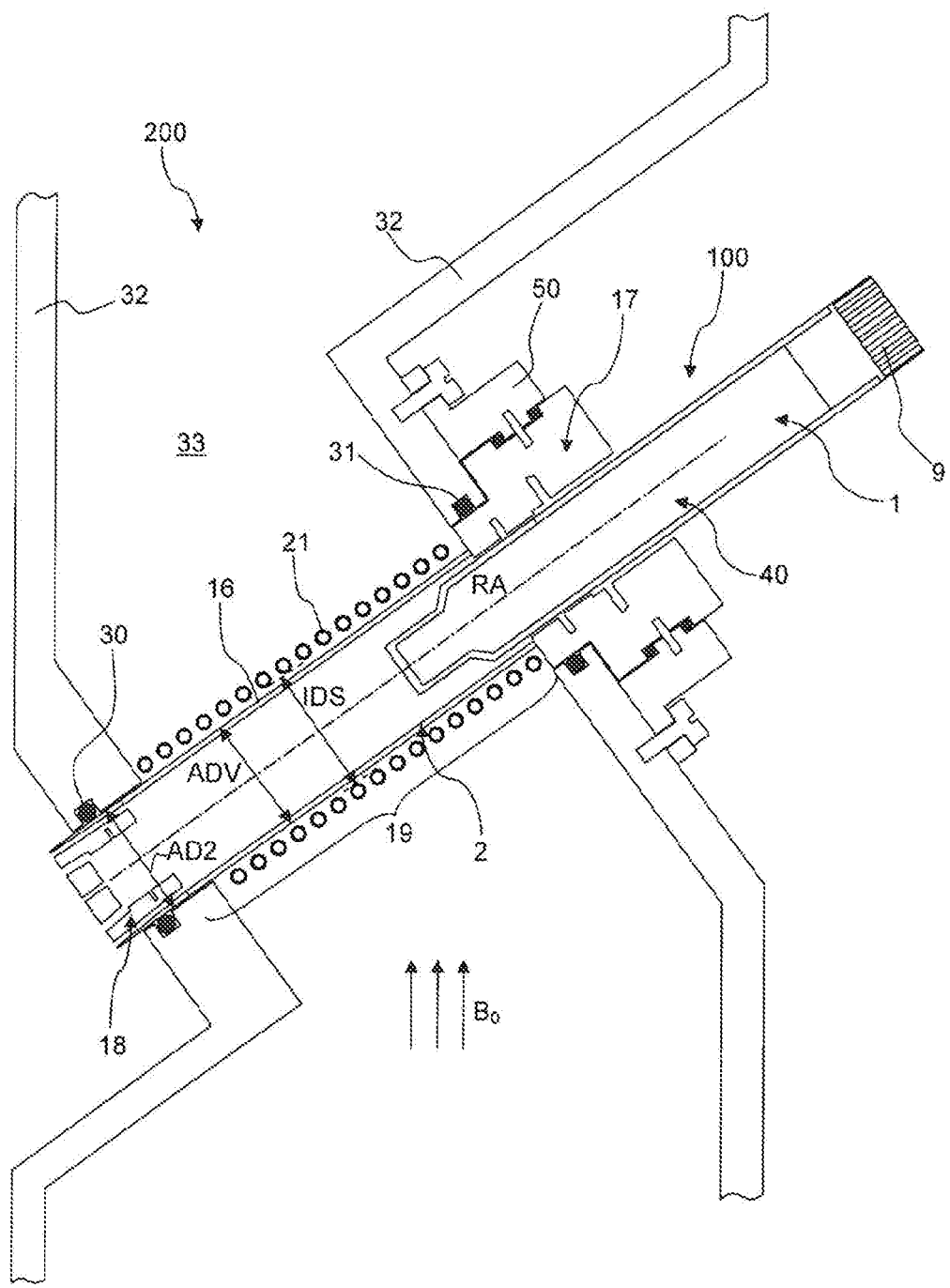
FIG. 4 shows a schematic cross-section through an embodiment of a probe head arrangement according to the invention, in which the stator is mounted at a fixed angle with respect to the probe head arrangement.

FIG. 4 shows, in a schematic sectional view, an embodiment of a probe head arrangement 200 according to the invention, in which an MAS NMR rotor system 100 as shown in FIG. 3 has been installed.

The probe head arrangement 200 includes a stator 2 in which a rotor 1 is rotatably supported about an axis of rotation RA; the rotor 1 is just being changed in FIG. 4 and is therefore only partially inserted axially into the stator 2. The rotor 1 is closed at the rear end by a cap 9. The stator 2 has two bearing bases 17, 18 which are mechanically connected via the sleeve element 16.

The probe head arrangement 200 includes an RF coil arrangement 21, wherein the least internal diameter IDS of the RF coil arrangement 21 is greater than the (greatest) external diameter AD2 of the second bearing base 18 and the (greatest) external diameter ADV in a frontal section 19 of the sleeve element 16 (which in this case includes the entire length of the sleeve element 16). As a result, the stator 2 can be guided, during installation or for maintenance purposes, through the RF coil arrangement 21 with the retaining component 50 removed. When inserted (pushed in), the stator 2 is held in a stator mount 32 which forms a stator bearing for it. The mount is designed in such a manner that the axis of rotation RA is aligned at the magic angle of 54.7° with respect to a magnetic field $B_0$ running vertically there.

The stator 2 with the gas-tight sleeve element 16, which is gas-tight toward the radial outside, is sealed relative to the stator mount 32 with the seals 30, 31, in this case in the region of the bearing bases 17, 18, such that the stator 2 and/or the sleeve element 16 also bounds a space 33; the space 33 is also bounded in this case by the stator mount 32 and other walls, which are not shown. In the space 33, which also contains the RF coil arrangement 21, a vacuum is established to thermally insulate the RF coil arrangement 21. This makes it possible, during an MAS NMR measurement, to cool the RF coil arrangement 21 to a cryogenic temperature (for example, 77 K, corresponding to liquid nitrogen at atmospheric pressure or—for cooling with, for example, liquid or gaseous helium—even lower temperatures, in particular ≤40 K, ≤20 K, or even in the region of 4.2 K, corresponding to liquid helium at atmospheric pressure), while the measurement substance 40 in the rotor 1 remains at a temperature in the vicinity of room temperature and/or can be set to a temperature in the range of −250° C. to +1000° C., in particular from −50° C. to +150° C., and more preferably in a temperature range from 0° C. to +50° C.

During the measurement, the rotor 1 rotates in the stator 2 about the axis of rotation RA, typically at a frequency of 10 kHz or more, and particularly at speeds in the range of 1 kHz to vs/(2πR1), where vs is the sound velocity of the gas surrounding the rotor 1 at prevailing pressure/temperature conditions, and the RF coil arrangement 21 radiates RF pulses into the measurement substance 40 in the rotor 1 and/or receives RF signals from the measurement substance 40. The strong static magnetic field $B_0$ in this case (with a vertical alignment in FIG. 4) acts on the measurement substance 40.

Preferably, all the gas flows are directed out from the two ends of the axially removable stator 2, such that it can be easily collected and recycled. This is advantageous, in particular, for low-temperature MAS, in order not to lose gas into the room air when He gas is used. Preferably, the gas is transferred directly into a dewar, such that it does not unnecessarily warm up, and an encapsulated gas cycle is created which only needs to compensate for the line losses and the friction in the rotor system 100 (aftercooling). The aftercooling is preferably carried out with heat exchangers and compression of the gas at room temperature (not shown in detail).

It is also advantageous to collect the gas flows on both ends of the stator 2 in the event that the MAS NMR probe arrangement 200 is used with toxic, carcinogenic, explosive, radioactive, or biohazardous measurement samples.

FIG. 5 shows a third design of an MAS NMR rotor system 100 for the invention, which largely corresponds with the embodiment of FIG. 3, such that only the main differences will be discussed below. In FIG. 5 at top, the stator 2 is shown with parts of a stator mount 32, into which it is partially pushed axially, and in FIG. 5 below, the MAS NMR rotor system 100 with stator 2 and rotor 1 and parts of the stator mount 32 is shown in the fully axially inserted state. The MAS NMR rotor system 100 is part of an MAS NMR probe head arrangement 200 according to the invention.

In the illustrated design, the rotor 1 is designed with an overall circular-cylindrical shape with a uniform radius, such that the radius R1 of the first bearing surface 10 of the first pneumatic bearing (radial bearing) 3 and the radius R2 of the second bearing surface 13 of the second pneumatic bearing (radial bearing) 4 are the same in this case—that is, R1=R2. On the rear end of the rotor 1, a cap 9 closes an opening 8 of the part of the rotor 1 which is made of glass in the form of a closed tube, by way of example (left side in FIG. 5), wherein the cap 9 has a radius R4 which is equal to the radius R1 in the region of the circular-cylindrical section 6. The rotor 1 with a uniform radius is easy to manufacture, robust against breakage, easy to handle during loading and transport, and also easy to control during the MAS NMR measurement as regards its rotation about the axis of rotation RA.

The stator 2 in this case has a first bearing base 17, a second bearing base 18, and a sleeve element 16 which connects the bearing bases 17, 18. The radius r1 at the nozzle openings 11 of the first pneumatic bearing (radial bearing) 3 in this case is equal to the radius r2 at the nozzle outlet openings 12 of the second pneumatic bearing (radial bearing) 4.

Since the radius of the rotor 1 does not widen beyond the second bearing base 18, a relatively large space 69 remains around the rotor 1, and/or a relatively large radial gap 70 remains between the outside of the rotor 1 and the inside of the stator 2 or the sleeve tube 16 in the frontal section 19. This allows a particularly efficient temperature control of the rotor 1, but the signal-to-noise ratio is reduced due to the comparatively small amount of measurement substance 40 radially inside the RF coil arrangement 21.

LIST OF REFERENCE NUMBERS 1 rotor
2 stator
3 first pneumatic bearing (radial bearing)
4 second pneumatic bearing (radial bearing)
5 third pneumatic bearing (axial bearing)
6 circular-cylindrical section
7 end section
7a front part (end section)
7b rear part (end section)
8 opening
9 cap
9a counterstructures
10 first bearing surface
11 nozzle outlet openings (first radial bearing)
12 nozzle outlet openings (second radial bearing)
13 second bearing surface
14 third bearing surface
15 nozzle outlet openings (axial bearing)
16 sleeve element
17 first bearing base
17a grooves
17b seals
18 second bearing base
19 frontal section
20 rear section
21 RF coil arrangement
21a coil carrier
21b conductor elements
22 pneumatic drive
30 second seal (sealing ring)
31 first seal (sealing ring)
32 stator mount
32a radial boundary
32b axial stop
33 gas-tight (evacuated) space
34 air outlet openings
34a air outlet openings (counter bearing)
35 counter bearing
36 nozzle outlet openings (counter bearing)
37 closure cap
38 gas flow feed
39 cap attachment
39a counterstructures
40 measurement substance
41 stator bearing
41a front part (stator bearing)
41b rear part (stator bearing)
42 shoulder
43 removable retaining part which engages from behind axially
44 elastic element
45 screw
50 movable retaining part
50a nose
52 pressure gas nozzles
53 baffle
54 gas outlet channel
55 variable aperture
61 stationary retaining part
59 space around rotor
70 radial gap
100 MAS NMR rotor system
200 probe head arrangement
AD1 external diameter (first bearing base)
AD2 external diameter (second bearing base)
ADV external diameter, frontal section
ADH external diameter, rear section
ER insertion direction
IDS least internal diameter (RF coil arrangement)
R1 radius (first bearing surface)
R2 radius (second bearing surface)
R3 outer radius (third bearing surface)
R4 radius (cap)
R5 radius (cap attachment)
r1 radius (nozzle outlet openings, first radial bearing)
r2 radius (nozzle outlet openings, second radial bearing)
RA axis of rotation
RR radial direction

What is claimed is:

1. A magic angle spinning (MAS) nuclear magnetic resonance (NMR) probe head arrangement, comprising:
a stator aligned along an axis of rotation and configured to support a rotor holding a measurement substance,
a stator mount,
a radio frequency (RF) coil arrangement configured to emit RF pulses into the measurement substance held in the rotor and/or to receive RF signals from the measurement substance held in the rotor, and
a mechanism,
wherein the stator comprises a first bearing base, a sleeve element, and a second bearing base, wherein the sleeve element connects the first bearing base and the second bearing base to each other axially as a unit, wherein the first bearing base is configured as a first pneumatic bearing and the second bearing base is configured as a second pneumatic bearing, wherein the second bearing base has a greatest external diameter AD2, wherein the sleeve element has a frontal section which adjoins the second bearing base axially and has a greatest external diameter ADV, wherein the RF coil arrangement has a least inner diameter IDS, wherein: AD2<IDS and ADV<IDS, wherein the stator mount is formed with a stator bearing configured for axial insertion and axial extraction of the stator as the unit into and from the stator mount, wherein the stator is configured to pass through the RF coil arrangement for axial insertion into and axial extraction from the stator mount, and wherein the mechanism is configured to fix the stator axially in the stator bearing when the stator is inserted into the stator mount.

2. The probe head arrangement according to claim 1, wherein the first bearing base and/or the sleeve element has a greatest external diameter AD1 in the region of the first bearing base, and wherein: AD1>IDS.

3. The probe head arrangement according to claim 1, wherein the stator mount has a first seal with which the first bearing base and/or the sleeve element is/are sealed in a gas-tight manner against the stator mount in the region of the first bearing base.

4. The probe head arrangement according to claim 1, wherein the stator mount has a second seal with which the second bearing base and/or the sleeve element is/are sealed in a gas-tight manner against the stator mount in the region of the second bearing base.

5. The probe head arrangement according to claim 1, wherein the sleeve element is gas-tight.

6. The probe head arrangement according to claim 1 and configured to form, when the stator is inserted, a gas-tight space which is bounded by the sleeve element, and in which the RF coil arrangement is arranged.

7. The probe head arrangement according to claim 6, wherein the gas-tight space is evacuated.

8. The probe head arrangement according to claim 6, wherein the RF coil arrangement in the gas-tight space is cooled to a cryogenic temperature T.

9. The probe head arrangement according to claim 8, wherein T≤40 K.

10. The probe head arrangement according to claim 6, wherein a space surrounding the rotor is cooled to a cryogenic temperature $T_R$.

11. The probe head arrangement according to claim 10, wherein the space surrounding the rotor within the stator is cooled to a cryogenic temperature $T_R$, where $T_R \leq 40$ K.

12. The probe head arrangement according to claim 1, wherein the mechanism configured to fix the stator in the stator bearing when inserted comprises a movable or detachable retaining part which axially engages behind the stator in a retaining position.

13. The probe head arrangement according to claim 12, wherein the movable or detachable retaining part is configured to engage on the stator in the region of the first bearing base.

14. The probe head arrangement according to claim 1, wherein the mechanism configured to fix the stator axially in the stator bearing when the stator is inserted into the stator mount comprises at least one stationary retaining part, and wherein the stationary retaining part is configured with an elastic element which, when the stator is inserted into the stator mount, presses against the stator in the radial direction.

15. The probe head arrangement according to claim 14, wherein the mechanism configured to fix the stator axially in the stator bearing when the stator is inserted into the stator mount comprises at least one further stationary retaining part, and wherein the two stationary retaining parts are each configured as sealing rings.

16. The probe head arrangement according to claim 1, where the stator mount forms an axial stop which defines a maximum axial insertion position of the stator in the stator mount.

17. The probe head arrangement according to claim 16, wherein the axial stop cooperates with a shoulder of the stator formed by the first bearing base or the sleeve element in a region surrounding the first bearing base.

18. The probe head arrangement according to claim 1, wherein:
the first pneumatic bearing and the second pneumatic bearing are configured to radially support the rotor in the stator, and
the rotor, when inserted into the stator, forms a first bearing surface at a radius R1 in the region of the first pneumatic bearing on a circular-cylindrical section of the rotor, and forms a second bearing surface at a radius R2 in the region of the second pneumatic bearing.

19. The probe head arrangement according to claim 1, further comprising a third pneumatic bearing disposed in one of the bearing bases and configured to hold the rotor axially in the stator.

20. The probe head arrangement according to claim 19, wherein the third pneumatic bearing is disposed in the second bearing base, and the rotor has a third bearing surface oriented perpendicular to the axis of rotation.

21. The probe head arrangement according to claim 19, further comprising a counter bearing in another of the bearing bases and constructed to hold the rotor arranged in the stator axially.

22. A method for measuring a measurement substance, comprising:
providing a probe head arrangement according to claim 1,
arranging a rotor in the stator, inserting and fixing the stator into the stator bearing, and
rotating the rotor about the axis of rotation at a frequency of at least 1 kHz.

* * * * *